United States Patent [19]

Kasuya

[11] 4,366,393
[45] Dec. 28, 1982

[54] INTEGRATED LOGIC CIRCUIT ADAPTED TO PERFORMANCE TESTS

[75] Inventor: Yoshihiro Kasuya, Tokyo, Japan

[73] Assignee: Nippon Electric Co., Ltd., Tokyo, Japan

[21] Appl. No.: 130,687

[22] Filed: Mar. 17, 1980

[30] Foreign Application Priority Data

| Mar. 15, 1979 | [JP] | Japan | 54-30243 |
| Mar. 15, 1979 | [JP] | Japan | 54-30253 |
| Mar. 15, 1979 | [JP] | Japan | 54-30254 |
| Mar. 15, 1979 | [JP] | Japan | 54-30256 |

[51] Int. Cl.³ .............. H03K 21/00; H03K 19/20
[52] U.S. Cl. .............. 307/221 R; 307/445; 307/471; 307/303; 324/158 R; 371/15
[58] Field of Search .............. 307/303, 221 R, 445, 307/471; 324/73 PC, 158 R; 371/15, 22

[56] References Cited

U.S. PATENT DOCUMENTS

| 3,651,315 | 3/1972 | Collins | 324/73 PC |
| 3,924,144 | 12/1975 | Hadamand | 307/221 R |
| 3,958,110 | 5/1976 | Hong et al. | 371/15 |
| 4,139,318 | 2/1979 | Schneider | 324/73 PC |
| 4,213,007 | 7/1980 | Funk | 371/22 |

*Primary Examiner*—Stanley D. Miller
*Assistant Examiner*—B. P. Davis
*Attorney, Agent, or Firm*—Sughrue, Mion, Zinn, Macpeak and Seas

[57] ABSTRACT

An easily testable integrated logic circuit utilizes a plurality of flip-flops to form a feedback shift register. In some embodiments, means are provided for selectively forming the flip-flops into a feedback shift register and for selectively supplying either the flip-flop contents or a random signal as partial inputs to the combinational logic circuit. In other embodiments, the feedback shift register is coupled to the AND logic array outputs of a combinational circuit which also includes an OR logic array.

9 Claims, 17 Drawing Figures

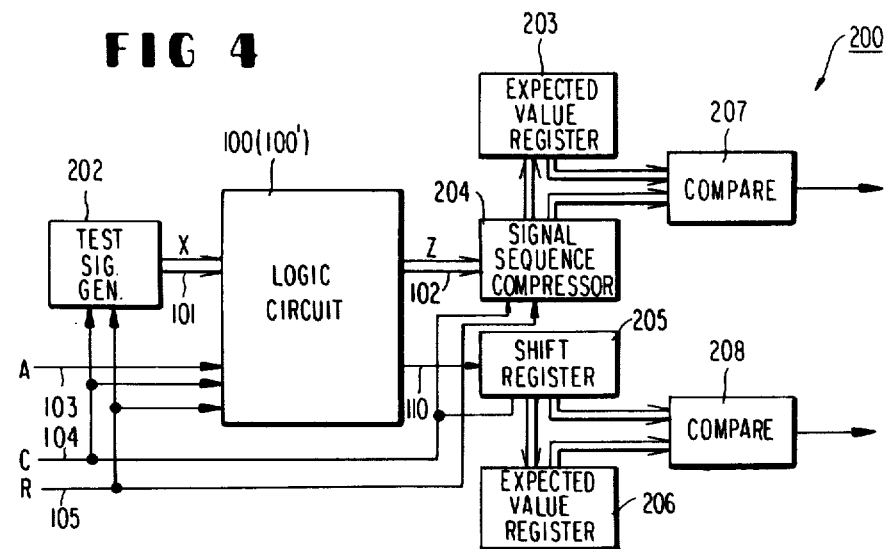
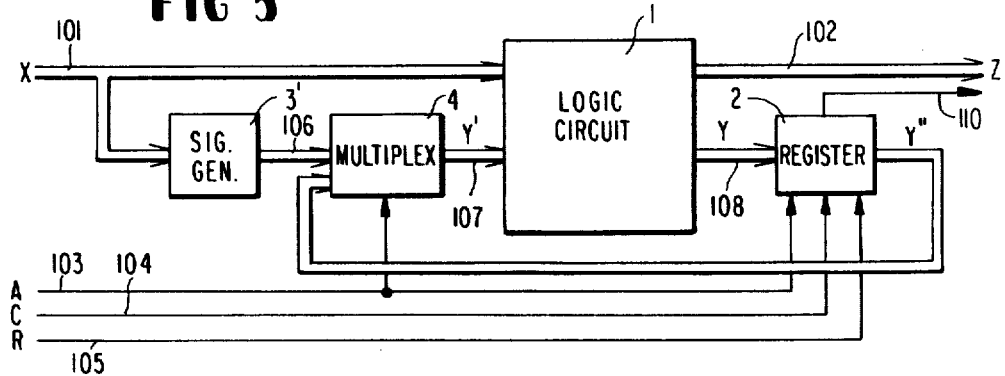
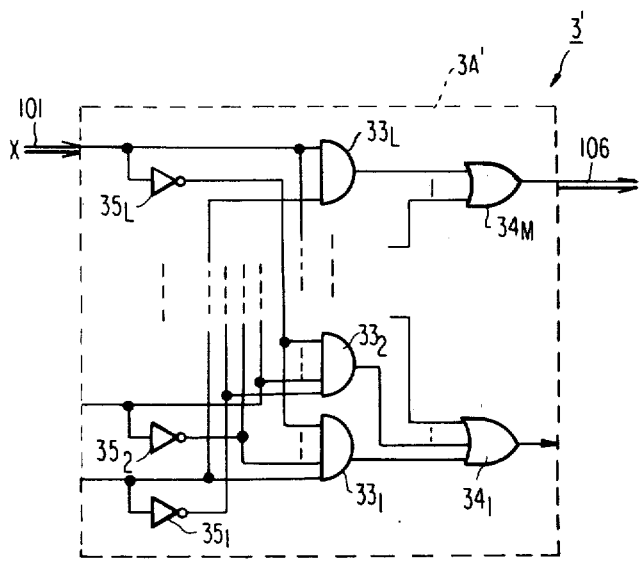
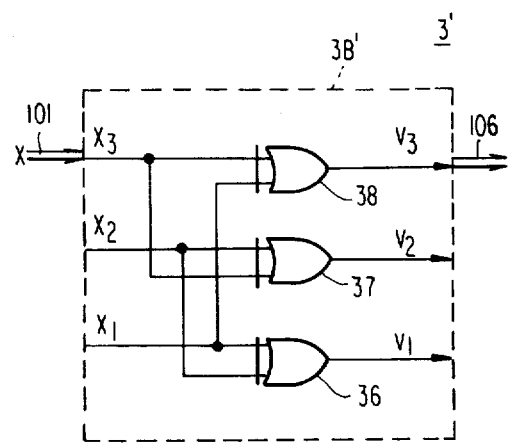

INTEGRATED LOGIC CIRCUIT ADAPTED TO PERFORMANCE TESTS

BACKGROUND OF THE INVENTION

The present invention relates to readily testable integrated logic circuits, and more particularly to general-purpose integrated logic circuits of systematic structure having built-in flipflops, whose structural elements can be readily tested for correct operation.

While circuit integration technology has achieved remarkable progress over recent years, successfully realizing high-density integration of highly complex logic functions, detection of faulty elements has been made even more difficult by such constraints as circuit complexity, limitation on the number of input and output terminals and the impossibility of directly inspecting the internal structure. Programmable logic arrays (hereinafter abbreviated to PLAs) find increasingly extensive use as general-purpose integrated logic circuit elements because of their versatility and design facility. They so much the more require ready detection of faulty elements.

However, testing a large integrated logic circuit with respect to all possible input combinations would take an enormous length of time. More recently, there have emerged PLAs which, having built-in flipflops, permit composition of sequential circuits capable of more complex logical operations, and their testing is even more difficult. These integrated logic circuits are, therefore, so designed in advance to allow ready examination of faulty elements whenever they arise.

Conventional circuit structures to facilitate testing of integrated logic circuits include one, as shown in the U.S. Pat. No. 3,958,110 entitled "LOGIC ARRAY WITH TESTING CIRCUITRY" issued to Hang et. al, in which outputs of specific signal lines (for example, the product term lines of an AND logic array) are received by a shift register whose content is led out. In another system known as the SCAN-PATH system, a group of flipflops which are present as internal memory elements for sequential circuit performance are interconnected to constitute the shift register for the testing purpose.

Both of these systems can give a large number of test outputs with the addition of a small number of observation terminals by taking out through a shift register the internal information of the circuit which is directly inaccessible, and thereby improve the testing capability. The SCAN-PATH system, in which the test input is inserted into the feedback loop by writing it into the shift register, can test even a sequential circuit performing complex logical operations merely as a combinational circuit.

These systems using a shift register, however, require advance preparation of the test inputs. Moreover, since information is written into or read out of the shift register in a scanning manner every time the test input is entered and the test result collected, not only is extra time spent in testing but also it is impossible to perform dynamic testing of circuit functions under their real conditions.

SUMMARY OF THE INVENTION

An object of the present invention, therefore, is to provide a testable integrated logic circuit which can make available a test input without requiring preparation and yet enable any fault to be examined in a dynamic state of high-speed circuit performance.

In accordance with this invention, there is provided a readily testable logic circuit comprising: a group of flipflops for feeding partial outputs of a combinational circuit back as partial inputs to said combinational logical circuit; a random signal generator circuit; means for composing said group of flipflops into a feedback shift register in response to an input control signal; means for applying said partial output signals of said combinational circuit to said feedback shift register by modulo 2 addition for each bit; and means for selectively applying one of said output signals of said group of flipflops and said random signal as a partial input of said combinational circuit. In a routine operation, the output signals of said group of flipflops are applied to the input of said combinational logical circuit. In testing, the random signal is applied to said combinational circuit and the partial output signal of said combinational logical circuit are accumulated in the feedback shift register, thereby to facilitate observation of the test results.

Testing of the integrated logic circuit of the present invention can be achieved by utilizing a different circuit structure from that operating in regular operation, i.e., by cutting off the feedback loop of the sequential circuit to separate the combinational circuit, using random signals as test input and further utilizing the group of flipflops, present as internal memory elements, as means for collecting the test results.

BRIEF DESCRIPTION OF THE DRAWINGS

The above and other objects, features and advantages of this invention will be understood from the following detailed description of preferred embodiments of this invention taken in conjunction with the accompanying drawings, wherein:

FIG. 4 is a block diagram of a testing device for the integrated logic circuit 100 of the first embodiment of this invention;

FIG. 5 is a block diagram of a second embodiment of this invention;

FIGS. 6 and 7 are block diagrams of first and second examples, respectively, of the random signal generator 3' used in the second embodiment shown in FIG. 5;

DETAILED DESCRIPTION OF THE PREFERRED EMBODIMENTS

Figure 1:
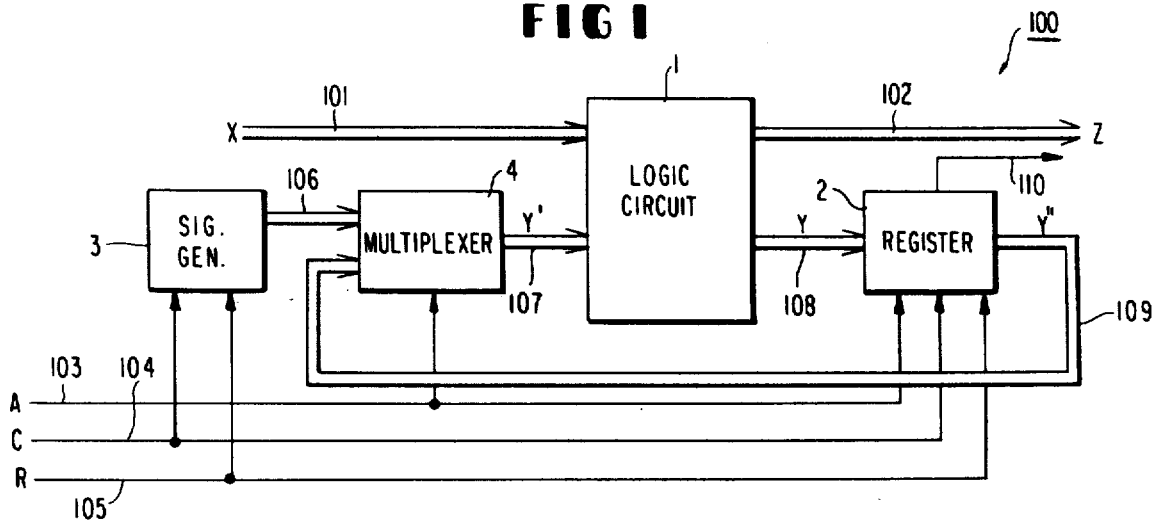
FIG. 1 is a block diagram of a first embodiment of this invention.

Referring now to FIG. 1, the first embodiment 100 comprises a multi-input, multi-output combinational logic circuit 1, which can be of any structure appropriate for the logic functions to be realized, e.g. an AND logic array and OR logic array in a PLA. The logic circuit 1 logically combines an external input X and a feedback input Y' and supplies an external output Z and a flipflop-driving signal Y. A register 2 includes a group of flipflops corresponding to the internal memory elements of a sequential circuit, and is also used as a compressor for the signal sequence.

The first embodiment 100 further comprises signal lines 101 for supplying the external input X, signal lines 102 for supplying the external output Z, signal lines 107 for supplying the feedback input Y', signal lines 108 for supplying the flipflop-driving signals Y and signal lines 109 feeding back the output Y'' of the register 2 to the input of the combinational circuit 1, and each of these signal lines 101, 102, 107, 108 and 109 transmits a plurality of signals. The integrated logic circuit 100 is a synchronous type and comprises signal line 104 for supplying a sync signal C from outside and signal lines 105 for supplying an initializing signal R to initialize the integrated logic circuit 100.

In order to distinguish testing from routine operation, a signal line 103 is provided for supplying a mode switching signal A to command switching between the routine operation and testing modes. A random signal generator 3 generates a random signal for the testing purpose. A multiplexer 4 selectively supplies the combinational logical circuit 1 with one of the random signal from the random signal generator 3 and the output Y'' from the register 2, respectively supplied through signal lines 106 and 109. A signal line 110 is provided for leading out the test result from the register 2.

Figure 2:
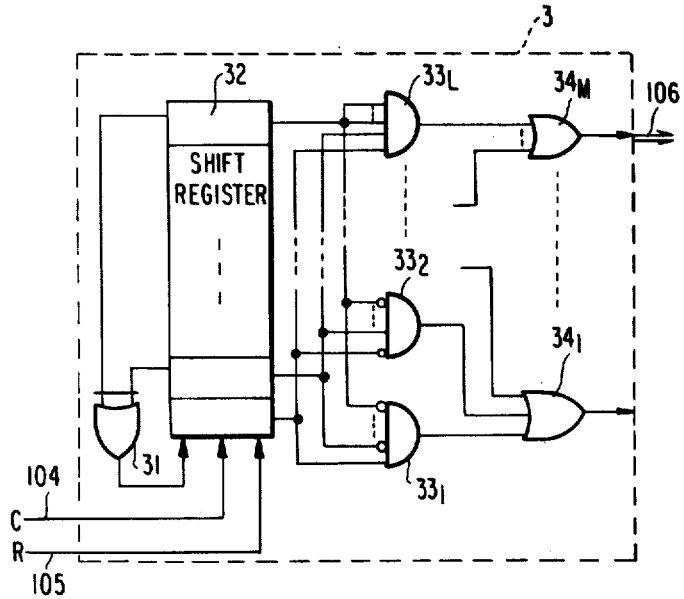
FIG. 2 is a block diagram of the random signal generator 3 used in the first embodiment shown in FIG. 1.

With reference to FIG. 2, the random signal generator 3 has a shift register 32 and an EXOR (exclusive OR) circuit 31. A linear feedback shift register is constituted by the shift register 32 and the EXOR circuit 31, in which signals at specific bit-positions in the shift register 32 are fed back through the EXOR circuit 31, whereby pseudo-random signals of the maximum sequence length can be produced. The shift register 32, when initialized by the initializing signal R into a predetermined state where not all bits are 0, produces a certain pseudo-random sequence in synchronization with the sync signal C.

AND circuits $33_1$, $33_2$, ..., and $33_L$ are each supplied with a different combination of output signals from some or all of the bit-positions in the shift register 32, or inverted signals thereof. Thus the AND circuits $33_1$, $33_2$, ..., and $33_L$ generate the pseudo-random sequence generated in the shift register 32 as pseudo-random signals differing in timing from one another. OR circuits $34_1$, $34_2$, ..., and $34_M$ are each supplied with a different combination of the output signals of the AND circuits $33_1$, $33_2$, ..., $33_L$. The OR circuits $34_1$, $34_2$, ..., and $34_M$ are thus intended for superimposing the pseudo-random signals led out by the AND circuits $33_1$, $33_2$, ..., and $33_L$ and differing in timing from one another and thereby adjusting them to a proper frequency of pulse generation. The number of the OR circuits $34_1$, $34_2$, ..., $34_M$ is equal to the bit number (M) of the feedback inputs Y'', and each OR circuit generates a different pseudo-random signal, which is supplied to a respective one of the signal lines 106.

Figure 3:
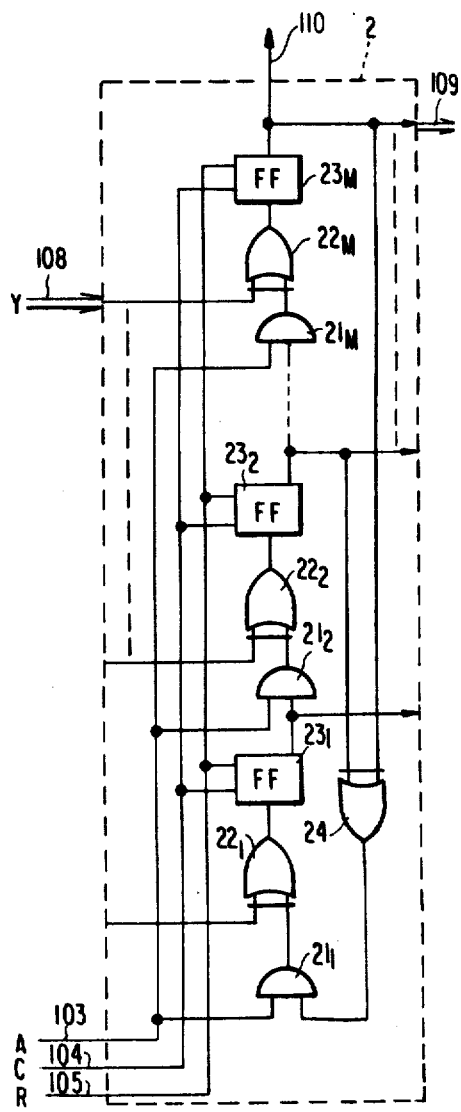
FIG. 3 is a block diagram of the register 2 used in the first embodiment shown in FIG. 1.

Referring to FIG. 3 showing a detailed block diagram of the register 2, master-slave type flipflops $23_1$, $23_2$, ..., and $23_M$ are initialized in a predetermined state by the initializing signal R, and driven by the sync signal C. EXOR circuits $22_1$, $22_2$, ..., and $22_M$ lead the flipflop driving signals Y to respective flipflops $23_1$, $23_2$, ..., and $23_M$. AND circuits $21_1$, $21_2$, ..., and $21_M$, in accordance with the instruction of the mode switching signal A, determine whether or not to transmit the content of the preceding flipflop to the following. An EXOR circuit 24 is supplied with the outputs of predetermined flipflops, i.e., of the flipflops $23_2$ and $23_M$, and generates and supplies the feedback signal to the flipflop $23_1$.

The function of the register 2 will be described below, first in its routine operating mode. When the mode switching signal A is of logical "0", all the outputs of the AND circuits $21_1$, $21_2$, ..., and $21_M$, which respectively are the inputs of the EXOR circuits $22_1$, $22_2$, ..., and $22_M$, are logical "0", with the result that the flipflop driving signals Y are passed intact through the EXOR circuits $22_1$, $22_2$, ..., and $22_M$ to the inputs of the respective flipflops $23_1$, $22_2$, ..., and $23_M$. This enables the flipflops $23_1$, $23_2$, ..., and $23_M$ to operate independently of one another as internal memory elements of the sequential circuit.

Next will be described its function in the testing mode. With the mode switching signal A turned to logical "1", the AND circuit $21_1$ transmits the feedback signal from the EXOR circuit 24 to the input of the first flipflop $23_1$ through the EXOR circuit $22_1$. Each of the AND circuits $21_2$, ..., and $21_M$ conveys the content of the preceding flipflop to the following, so that the flipflops $23_1$, $23_2$, ..., and $23_M$ operate as a feedback shift register. Further, the flipflop driving signals Y are superimposed on the feedback signal by passing through the EXOR circuits $22_1$, $22_2$ ..., and $22_M$. Generally, since a feedback shift register changes its memory content depending on previously impressed signal sequences, it has the effect of compressing long signal sequences. Accordingly, when the feedback shift register is initialized by the initializing signal R and driven by the sync signal C for a certain period of time, the signal sequence in the flipflop driving signal Y is compressed and stored as specific bit patterns in the flipflops $23_1$, $23_2$, ..., and $23_M$. The signal sequence led to the output line 110 of the flipflop $23_M$, whose sequence-length is equal to the number (M) of the flipflops $23_1$, $23_2$, ..., and $23_M$, is equivalent to the information stored in the flipflops $23_1$, $23_2$, ..., and $23_M$. This principle is utilized for fault detection.

The operation of the integrated logic circuit 100 will be comprehensively described below, again with reference to FIG. 1. For routine function, the mode switching signal A is set at logical "0". Then, the register 2 operates merely as memory elements for the internal conditions of the circuit 100, and the multiplexer 4 supplies the output Y'' of the register 2 as the feedback input Y' of the combinational circuit 1, so that the circuit 100 constitutes a regular sequential circuit and is enabled to perform its routine function.

For the testing mode, the mode switching signal A is set at logical "1" so that the register 2 constitutes a feedback shift register and serves as a signal sequence compressor, and the multiplexer 4 supplies the random signal from the random signal generator 3 to the combinational circuit 1. When the sync signal C is supplied after applying the initializing signal R to the random signal generator 3, the random signal generator 3 generates and supplies the combinational circuit 1 with certain pseudo-random signals. At the same time, the external input X is supplied to the combinational circuit 1, which provides the external output Z and the flipflop driving signal Y. The signal Y is compressed and stored in the feedback register 2. The content stored in the register 2 can be inspected by observing the signal sequences successively coming out on the signal line 110, so that the test results can be easily assessed.

Further to illustrate the effects of the present invention, one example of the testing method for the integrated logical circuit 100 will be described below with reference to FIG. 4. A testing device 200 is intended for testing the integrated logic circuit 100 and comprises a test signal generator 202, expected value registers 203 and 206, a signal sequence compressor 204, a shift register 205 and comparators 207 and 208. The test signal generator 202 for providing a prescribed test input may be similar to the random signal generator 3 (FIG. 2). The signal sequence compressor 204 for compressing and storing the external output Z of the integrated logic circuit 100 may be structured similarly to the register 2 (FIG. 3).

Testing is achieved by indirectly comparing the output results of a master integrated logic circuit which has been confirmed to correctly function and those of the integrated logic circuit which is to be tested. To distinguish the two from each other, the former will be hereinafter referred to with numeral 100, and the latter with 100'.

In the testing procedure, first the master integrated logic circuit 100 is properly set. After impressing the initializing signal R in the testing mode, the sync signal C is supplied to the integrated logic circuit 100 and the test signal generator 202. The test input generated by the test signal generator 202 is applied to the circuit 100. The output Y of the integrated logic circuit 100 is compressed by the register 2 (FIG. 3) and successively derived at the signal line 110. The signal at the line 110 is shifted into the shift register 205 for storing. The output Z of the integrated logic circuit 100 is compressed by and stored in the signal sequence compressor 204. After the above procedure has been completed, the data stored in the signal sequence compressor 204 and shift register 205 representing the output results of the correctly-operated master integrated logic circuit 100, are then transferred to the expected value registers 203 and 206, respectively.

Next, the integrated logic circuit 100' to be tested is properly set and subjected to exactly the same procedure as described above. The output results of the integrated logic circuit 100' are compressed and stored in the signal sequence compressor 204 and the shift register 205. After that, the content of the signal sequence compressor 204 is compared with that of the expected value register 203, and the content of the shift register 205 is compared with the content of the expected value register 206, by the comparators 207 and 208, respectively, to check whether the corresponding contents are coincident with each other. If both the comparators 207 and 208 give outputs indicating coincidence, the integrated logic circuit 100' can be considered highly probable to be a satisfactory product. If, conversely, at least one of the comparators 207 and 208 gives an output indicating the incoincidence, the integrated logic circuit 100' will be judged faulty.

Referring to FIG. 5, the second embodiment comprises a random signal generator circuit 3' to which some or all of the external input X is supplied, and is exactly the same in all other components as the first embodiment illustrated in FIG. 1.

With reference to FIG. 6, a first example 3A' of the random signal generator 3' has NOT circuits $35_1, 35_2, \ldots,$ and $35_N$ for inverting the external input X, AND circuits $33_1, 33_2, \ldots,$ and $33_L$ for picking out different combinations of the signals of the external input X and the inverted signals thereof, and OR circuits $34_1, \ldots,$ and $34_M$ for picking out in different combinations of the outputs of the AND circuits $33_1, 33_2, \ldots,$ and $33_L$.

When a signal sequence is supplied to the external input X, a specific combination of signals is detected in each of the AND circuits $33_1, 33_2, \ldots,$ and $33_L$ and conveyed to the output. The signal sequences from the AND circuits $33_1, 33_2, \ldots,$ and $33_L$ at different timings are applied to the OR circuits $34_1, \ldots,$ and $34_M$ and adjusted a proper frequency of pulse generation.

At the output of each OR gate $34_1, \ldots,$ and $34_M$ is obtained a signal sequence resulting from the conversion of the external input X into a pseudo-random sequence, which is supplied to the signal line 106. When a random signal sequence is supplied as the external input X, the circuit 3A' generates another random signal sequence.

Figure 8:
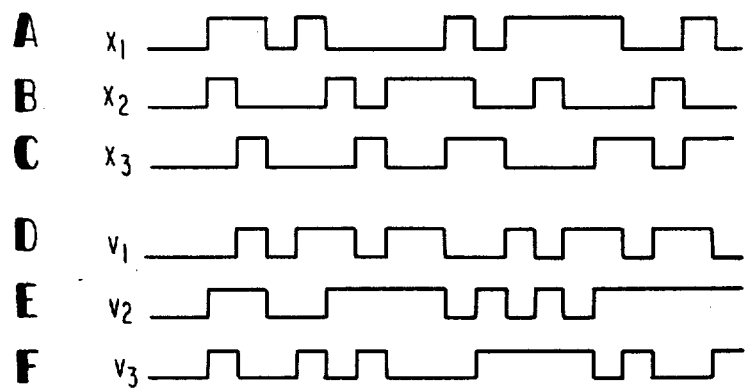
FIGS. 8A through 8F are waveform diagrams of signals appearing at various parts of the second example of the random signal generator 3' shown in FIG. 7.

Referring to FIG. 7, a second example 3B' of the random signal generator circuit 3' has three EXOR circuits 36, 37 and 38. When external inputs X ($X_1, X_2, X_3$) shown in FIGS. 8A–8C are supplied to the EXOR circuits 36–38, the outputs of the random signal generator circuit 3B' (outputs of the EXOR circuits 36–38) provide different signal sequences V ($V_1, V_2, V_3$) shown in FIGS. 8D–8F.

The second embodiment is characterized in that it further randomizes the test input impressed as external input and thereby obtains another test input which has to be inserted into the feedback loop.

In the two embodiments described above, testing is facilitated by restructuring the existing flipflops into the feedback shift register to permit observation of signals in the circuit, especially those concerning the feedback loop. Additional observation of specifically designated signals in the circuit helps further improve the testing efficiency. In the PLA referred to above, for example, the output of the product term line of the AND logic array can give useful information for testing. Such embodiments will be described hereunder.

Figure 9:
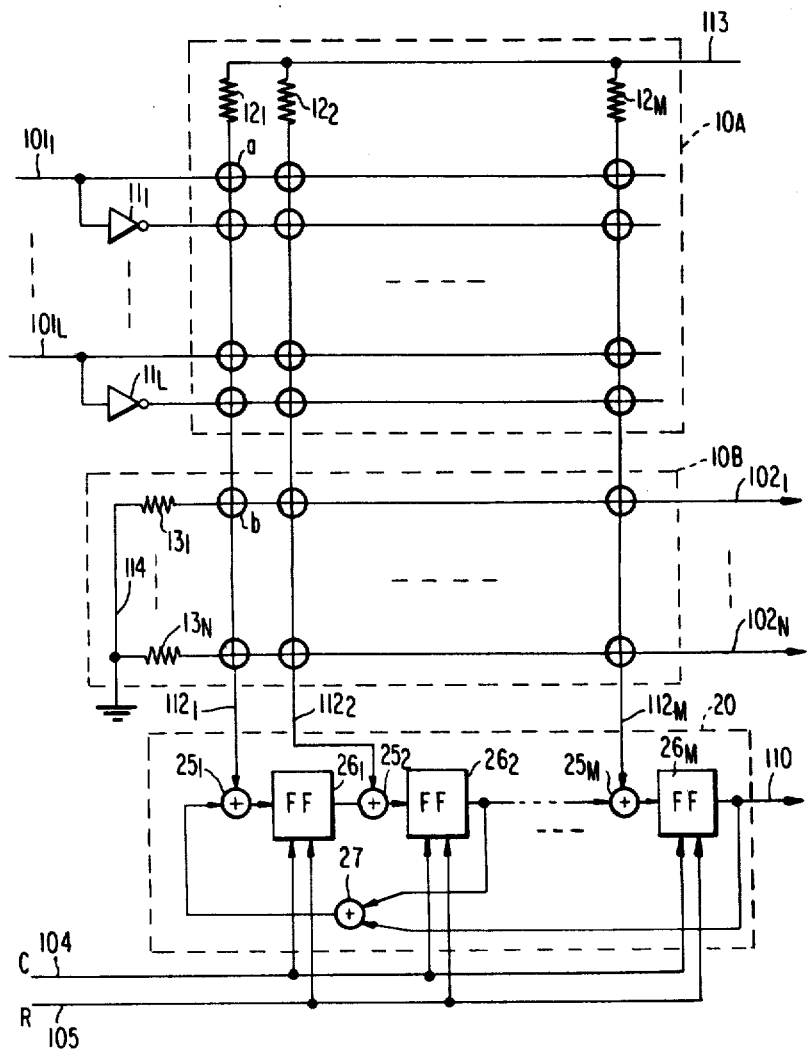
FIG. 9 is a block diagram of a third embodiment of this invention.
Figure 10:
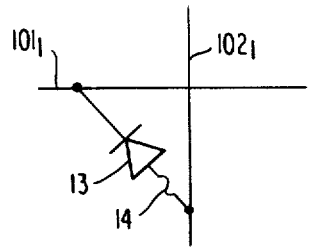
FIG. 10 illustrates an example of a diode matrix.

Referring to FIG. 9, a third embodiment has an AND logic array 10A and an OR logic array 10B each consisting of a programmable diode matrix. Each of the intersections a and b of the diode matrices of the logic arrays 10A and 10B, as illustrated in FIG. 10, has a diode 13 and a fuse 14. It is made possible to program said logic arrays 10A and 10B as desired by, for instance, electrically cutting off the fuse 14.

External input signals impressed on the AND logic array 10A through external input signal lines $101_1, \ldots,$ and $101_L$ are of binary signals. NOT circuits $11_1, \ldots,$ and $11_L$ are supplied with the binary signals from the external input signal lines $101_1, \ldots,$ and $101_L$, and supply the inverted binary signals to other input signal lines of the AND logic array 10A. At output signal lines $112_1, 112_2, \ldots,$ and $112_M$ of the AND logic array 10A are obtained the logical products of the binary signals given to the external input signal lines $101_1, \ldots,$ and $101_L$ by the logical combinations programmed in the AND logic array 10A. Thus, the lines $112_1, 112_2, \ldots,$ and $112_M$ are product term lines. From a power supply line 113 is fed a positive voltage. One end each of resistors $12_1, 12_2, \ldots,$ and $12_M$ is connected to the power supply line 113, and the other to the product term lines $112_1, 112_2, \ldots,$ and $112_M$, to drive them. Signal lines $102_1, \ldots,$ and $102_M$ i.e., the output signal lines of the OR logic array 10B constitute output signal lines to transmit the two-value outputs of this integrated logical operation circuit. One end each of resistors $13_1, \ldots,$ and $13_N$ is connected to a grounding conductor 114, and the other to the external output signal lines $102_1, \ldots,$ and $102_N$.

A feedback shift register 20 added to facilitate testing in accordance with the present invention has EXOR circuits $25_1, 25_2, \ldots,$ and $25_M$ and master-slave type flipflops $26_1, 26_2, \ldots,$ and $26_M$. A multi-input EXOR circuit or modulo 2 adder 27 produces a feedback signal by modulo 2 addition of the output signals of one or more flipflops in a predetermined position or positions out of the flipflops $26_1, 26_2, \ldots,$ and $26_M$. The output signal of the product line $112_1$ undergoes modulo 2 addition to the output signal of the adder 27 in the EXOR circuit $25_1$, and the output of the EXOR circuit $25_1$, is conveyed to the input of the first flipflop $26_1$. The output signal of the product term line $112_2$ undergoes modulo 2 addition to that of the preceding flipflop $26_1$ in the EXOR circuit $25_2$, whose output is conveyed to the input of the following flipflop $26_2$, and similarly the output signal of each of the subsequent product term lines until $112_M$ undergoes modulo 2 addition to the output of the preceding flipflop and is conveyed to the following flipflop.

The flipflops $26_1, 26_2, \ldots,$ and $26_M$ are initialized in a predetermined state by the initializing signal R. The output line 110 of the final flipflop $26_M$ is connected to an external terminal. Generally, since a feedback shift register changes its memory content depending on previously impressed signal sequences, it has the effect of compressing long signal sequences. Accordingly, when this feedback shift register 20 is initialized and driven by the sync signal C for a certain period of time, the signal sequences emerging on the product term lines $112_1, 112_2, \ldots,$ and $112_M$ are compressed and stored as specific bit patterns in the flipflops $26_1, 26_2, \ldots,$ and $26_M$. The signal sequence at the output line 110 of the final flipflop $26_M$ can be applied to and observed with a shift register (for example, 205 in FIG. 4) having as many bits as the number of flipflops $26_1, 26_2, \ldots,$ and $26_M$.

If there is any fault at, for instance, the intersection a of the diode matrices of the AND logic array 10A and said intersection a is excited by said test input signal sequence, erroneous signals will be generated on the product term line passing said intersection a, i.e. the results of said AND operation will be erroneously supplied. Accordingly the results accumulated in the feedback shift register 20 will differ from normal results and the signal sequence led out to the signal line 110 will also differ from the normal sequence. The foregoing description has made apparent how easily any fault in the AND logic array 10A can be detected.

Any fault in the OR logic array 10B can be easily detected because its output signal lines $102_1, \ldots,$ and $102_M$ are directly observable from outside. The third embodiment has an advantage that the information obtained on the product term lines $112_1, 112_2, \ldots,$ and $112_M$, not directly observable from outside, is made indirectly accessible through the feedback shift register 20 and accordingly the AND logic array 10A and OR logic array 10B are in effect separately inspected, resulting in greater testing accuracy.

Where the PLA has a built-in register, provision of a means capable of having the register operate as a feedback shift register would make the PLA exactly the same as the first or second embodiment.

Figure 11:
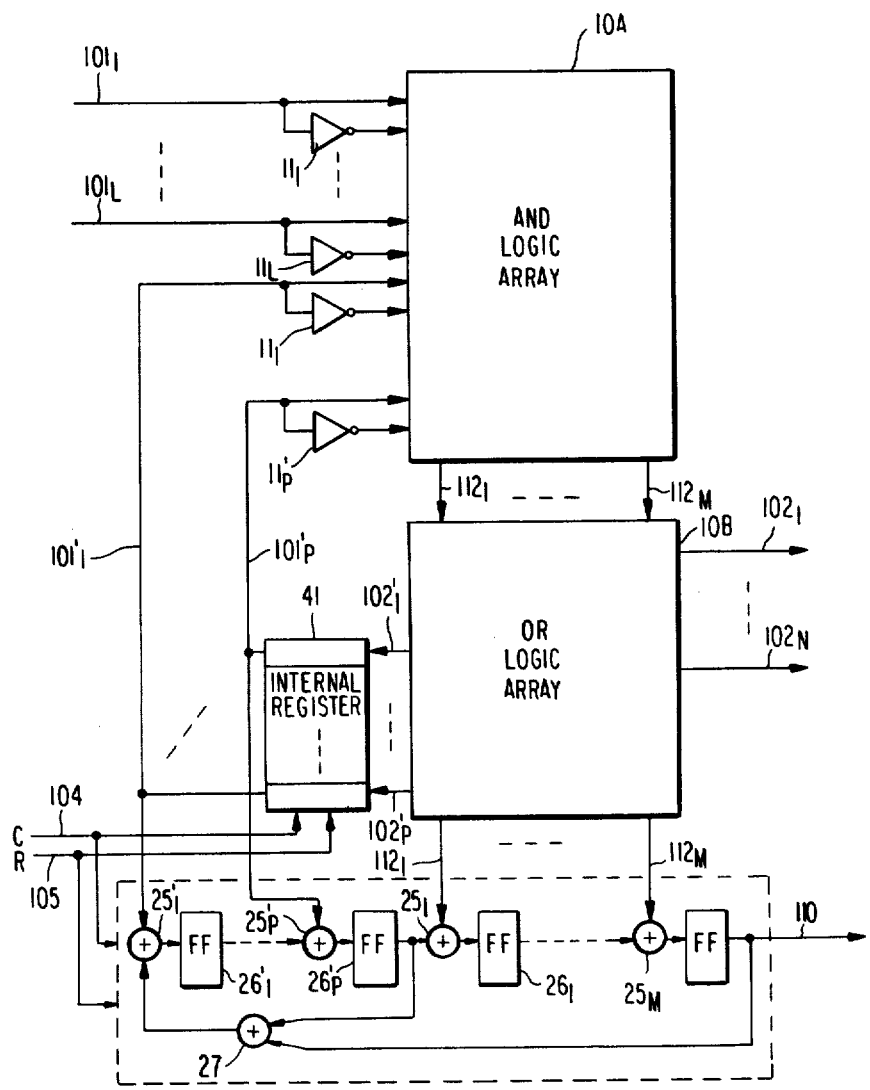
FIGS. 11 and 12 are block diagrams of fourth and fifth embodiments, respectively, of this invention.

Referring to FIG. 11 showing the fourth embodiment, signals on output signal lines $102_1', \ldots,$ and $102_p'$ of the OR logic array 10B drive an internal register 41, whose output signals are applied through lines $101_1', \ldots,$ and $101_p'$ to the AND logic array 10A as the internal feedback signals. NOT circuits $11_1', \ldots,$ and $11_p'$ invert the internal feedback signals and impress the inverted signals on some of the inputs of the AND logic array 10A. The PLA with a built-in register thereby constitutes a sequential circuit.

A feedback register 20' is structured similarly to the feedback shift register 20 in FIG. 9. The EXOR circuits $25_1', \ldots,$ and $25_p'$ are supplied with the internal feedback signals and EXOR circuits $25_1, \ldots,$ and $25_M$ with the signals from the product term lines $112_1, \ldots,$ and $112_M$ of the AND logic array 10A. The EXOR circuits 25' and 25 individually perform modulo 2 additions. The feedback shift register 20' compresses and stores signal sequences emerging on the signal lines $101_1', \ldots,$ and $101_p'$ and on the product term lines $112_1, \ldots,$ and $112_M$.

Figure 12:
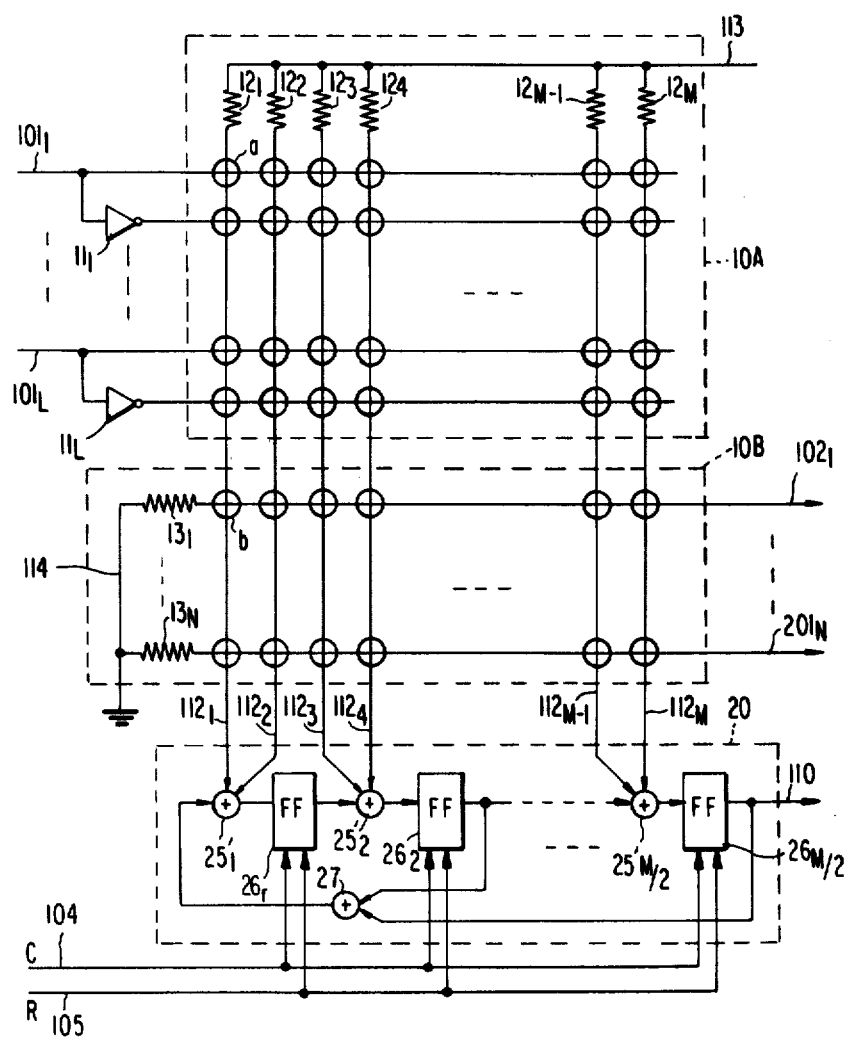

Referring to FIG. 12 illustrating a fifth embodiment, the output lines are divided into pairs, such as the product term line pairs $112_1$ and $112_2$, $112_3$ and $112_4, \ldots,$ and $112_{M-1}$ and $112_M$. EXOR circuits $25_1', 25_2', \ldots,$ and $25_{M/2}'$ and flipflops $26_1', 26_2', \ldots,$ and $26_{M/2}'$ are so arranged as to respectively correspond to the product term line pairs $112_1$ and $112_2$, $112_3$ and $112_4, \ldots,$ and $112_{M-1}$ and $112_M$. The multi-input EXOR circuit 27 produces the feedback signal by modulo 2 addition of the output signals of one or more flipflops in a predetermined position or positions of the flipflops $26_1', 26_2', \ldots,$ and $26_{M/2}'$. The fifth embodiment is structured and functions in exactly the same manner as the third embodiment except that the product term lines are paired here.

What calls for attention with respect to the fifth embodiment is that the pairing of product term lines may invite the simultaneous supplying of erroneous signals to a plurality of product term lines with the result that these errors will be overlooked and this problem will be considered hereunder. This disadvantage derives from the modulo 2 addition of a pair of product term lines. When, for instance, the product term lines $112_1$ and $112_2$ simultaneously give erroneous signals, the output of the EXOR circuit $25_1$ is the same as what it ought to be, and generally when erroneous signals are simultaneously supplied by an even number of product term lines out of a plurality of such lines belonging to one group, these errors are overlooked. However, the probability of the constant occurrence of an even number of erroneous signals is likely to be extremely small if a sufficiently large number of test input signals are used, though said probability depends in part on the number of product term lines belonging to one group. The occurrence of such a state can further be avoided by so selecting test input signals as to excite specific product term lines. If two product term lines give exactly the same output signals, including erroneous lines, in response to all combinations of input signals, the logical products programmed on these two product term lines will be identical, and by programming such logical products on product term lines belonging to different pairs, a state in which said errors are overlooked can be averted. The problem thus results in no significant invites disadvantage to the present invention.

To sum up the foregoing description, the advantages of the present invention include the applicability of such easily available random test input signals, accumulation of the test results in a feedback shift register consisting of a group of flipflops, and facilitation of testing by making possible observation with a single signal line without substantially increasing the number of output lines (terminals). Another advantage of this invention is that, since the test results need not be examined one by one but fault detection is possible merely from the final results of a series of testing procedures, the testing can be accelerated without waste of time in the testing process.

The present invention therefore proves particularly effective when applied to such an integrated logic circuit as one formed on a single chip, which does not permit direct observation of its internal structure and is restricted in the number of input and output terminals.

It also is possible to apply this invention to an integrated logic circuit having a regular structure, such as a PLA.

What is claimed is:

1. An easily testable integrated logic circuit, comprising:
    a logic circuit receiving a plurality of first inputs and a plurality of second inputs for providing logic outputs;
    means for generating a random signal;
    multiplexing means having first and second multiplexing inputs and which, in response to a control signal, selectively supplies said first multiplexing inputs as said second logic inputs, said first multiplexing inputs being received from said random number generator;
    means for applying said control signal to said multiplexing means;
    a plurality of flip-flops for receiving and storing outputs from said logic circuit, the outputs of said flip-flops being fed back to the second input of said multiplexing means; and
    means for coupling said flip-flops to form a feedback shift register in response to said control signal, the output of one of said flip-flops constituting the output of said feedback shift register.

2. An easily testable integrated logic circuit as defined in claim 1, wherein said random signal generator comprises:
    a linear feedback shift register;
    a plurality of AND circuits each receiving a different combination of outputs from said linear feedback shift register; and
    a plurality of OR circuits each receiving and combing different combinations of the outputs from said plurality of AND circuits, the outputs of said plurality of OR circuits constituting said random signal provided as said first multiplexing input.

3. An easily testable integrated logic circuit as defined in claim 1, wherein said random signal generator comprises:
    a plurality of signal generator input terminals for receiving respective ones of said plurality of first logic circuit inputs;
    a plurality of inverting means for providing inverted first logic circuit inputs;
    a plurality of AND circuits for receiving and combining selected combinations of said first logic circuit inputs and said inverted first logic circuit inputs; and
    a plurality of OR circuits for receiving and combining selected combinations of the outputs of said plurality of AND circuits, the outputs of said plurality of OR circuits constituting said random signal provided as said first multiplexing input.

4. An easily testable integrated logic circuit as defined in claim 1, wherein said random signal generator comprises a plurality of Exclusive OR (EOR) circuits for receiving and combining selected ones of said plurality of first logic circuit inputs, the outputs of said plurality of EOR circuits constituting said random signal provided as said first multiplexing input.

5. An easily testable integrated logic circuit as defined in any of claims 1–4, wherein there are M flip-flops and the output of the Mth flip-flop constitutes the output of said feedback shift register, said means for coupling comprising:
    a plurality of EOR circuits, each having first and second inputs and each providing its output as an input to a respective one of said flip-flops, each of said EOR circuits receiving its first input from a different one of said combinational logic circuit outputs;
    a feedback EOR circuit for receiving and combining the outputs from selected ones of said plurality of flip-flops; and
    a plurality of M AND circuits having first and second inputs and an output, each of said plurality of M AND circuits providing its output as the second input to a respective one of said last-mentioned plurality of EOR circuits and each receiving said control signal at its first input, (M−1) of said M AND circuits receiving their second inputs from respective flip-flop outputs, the remaining one of said M AND circuits receiving its second input from the output of said feedback EOR circuit.

6. An easily testable integrated logic circuit comprising:
    a combinational logic circuit including at least one of an AND logic array and an OR logic array, said AND logic array having a plurality of first input terminals and having a plurality of first output terminals on which are provided logical products of selected combinations of said first input terminals, said OR logic array having a plurality of second input terminals and having a plurality of second output terminals on which are provided logical sums of selected combinations of said second input terminals; and
    a feedback shift register comprising: M flip-flops each having an input and an output, the output of one of said flip-flops constituting the output of said feedback shift register; a feedback modulo-2 adder for receiving and combining the outputs from selected ones of said M flip-flop; and M modulo-2 adders having at least first and second inputs and an output, each of said M modulo-2 adders providing its output as an input to a different one of said flip-flops, each receiving as its first input a different one of array outputs from said first output terminals or said second output terminals, (M−1) of said M modulo-2 adders receiving their second inputs from the outputs of respective ones of said flip-flops, and the remaining one of said M modulo-2 adders receiving as its second input the output from said feedback modulo-2 adder.

7. An easily testable integrated logic circuit as defined in claim 6, wherein there are 2M outputs from said logic array, and each of said M modulo-2 adders includes a third input receiving a different one of said logic array outputs, whereby each of said M modulo-2 adders receives and combines a respective pair of said logic array outputs.

8. An easily testable integrated logic circuit, comprising:
   a combinational logic circuit including an AND logic array having a plurality of input terminals and having a plurality of output terminals on which are provided logical products of selected combinations of said input terminals, and an OR logic array for receiving as inputs the outputs from said AND logic array and having output terminals on which are provided logical sums of selected combinations of said AND logic array outputs;
   an internal register having P stages for receiving P different outputs from said OR logic array, the contents of said internal register being provided as inputs to said AND logic array;
   a feedback shift register comprising: a first plurality of M flip-flops each having an input and an output, the output of one of said M flip-flops constituting an output of said feedback shift register; a second plurality of P flip-flops each having an input and an output;
   a feedback modulo-2 adder for receiving and combining selected outputs from said first and second pluralities of flip-flops;
   a first plurality of P modulo-2 adders each having at least first and second inputs and an output, each of said P modulo-2 adders providing its output as an input to one of said P flip-flops and each receiving as its first input the contents from a respective stage of said internal shift register, (P−1) of said first plurality of modulo-2 adders receiving their second inputs from the outputs of respective ones of said P flip-flops, the remaining one of said P modulo-2 adders receiving its second input from the output of said feedback modulo-2 adder; and
   a second plurality of M modulo-2 adders each having at least first and second inputs and an output, each of said M modulo-2 adders providing its output as an input to one of said M flip-flops and each receiving as its first input a respective output from said AND logic array, (M−1) of said second plurality of modulo-2 adders receiving their second inputs from the outputs of respective ones of said M flip-flops, the remaining one of said M modulo-2 adders receiving its second input from the output of one of said P flip-flops.

9. An easily testable integrated logic circuit, comprising:
   a logic circuit receiving a plurality of first inputs and a plurality of second inputs for providing logic outputs;
   a feedback shift register including a plurality of flip-flops for receiving and storing said logic outputs from said combinational logic circuit, said feedback shift register compressing a signal sequence in said outputs
   a test signal generator for providing a test signal as said first logic circuit inputs;
   a testing shift register for receiving and storing the signal sequence provided at the output of said feedback shift register;
   a first expected value register for storing a value which should be present in said testing shift register if said integrated logic circuit is not faulty;
   a second expected value register for storing the contents which should be present in said feedback shift register when said integrated logic circuit is not faulty;
   a first comparator for comparing the contents of said testing shift register and said first expected value register; and
   a second comparator for receiving and comparing the contents of said feedback shift register and said second expected value shift register.

* * * * *